(12) United States Patent
Shinkawata

(10) Patent No.: US 6,690,045 B2
(45) Date of Patent: Feb. 10, 2004

(54) SEMICONDUCTOR DEVICE WITH REDUCED CMP DISHING

(75) Inventor: Hiroki Shinkawata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/915,566

(22) Filed: Jul. 27, 2001

(65) Prior Publication Data

US 2002/0089036 A1 Jul. 11, 2002

(30) Foreign Application Priority Data

Jan. 10, 2001 (JP) .................................. 2001-002331

(51) Int. Cl.[7] .................. H01L 23/48; H01L 23/52; H01L 29/40
(52) U.S. Cl. ............................................. 257/258
(58) Field of Search ................. 257/296–310, 257/758–776; 438/253–254, 197

(56) References Cited

U.S. PATENT DOCUMENTS

| | | |
|---|---|---|
| 5,715,346 A | 2/1998 | Liu |
| 6,261,883 B1 * | 7/2001 | Koubuchi et al. .......... 257/776 |

FOREIGN PATENT DOCUMENTS

| | | | |
|---|---|---|---|
| JP | 61-113007 | 5/1986 | |
| JP | 64-9406 | 1/1989 | |
| JP | 10-335333 | 12/1998 | |
| JP | 11-126822 | 5/1999 | |
| JP | 2000-309923 | * 3/2000 | |
| JP | 2000-223492 | 8/2000 | |

OTHER PUBLICATIONS

"Long–Haul 16x10 WDM Transmission Experiment Using Higher Order Fiber Dispersion Management Technique", by Murakami et al., ECOC'98 (Sep. 20–24, 1998), pp. 313–314.

"Design and Performance of Ultra–Low–Loss Single–Mode Fiber Cable in 1.5–$\mu$m Wavelength Region", by Kitayama et al., Journal of Lightwave Technology, vol. LT–3, No. 3 (Jun. 1985), pp. 579–585.

"338 Structural Design of the Single–Mode Optical Fiber for 1.55–$\mu$m Band Submarine Optical System", by Kimura et al., Proceedings for the 1982 National Conference of Communication Engineering Branch of Institute of Electronics and Communication Engineers of Japan, pp. 2–74 (with English translation).

"Design Consideration of Single–Mode Optical Fiber Parameters", by Tateda et al., pp. 324–330 (with English Translation).

"Ultra–Low Non–Linearity Low–Loss Pure Silica Core Fiber for Long–Haul WDM Transmission", by Kato et al., Proceedings for the 1999 Conference of Electronics Society of Institute of Electronic and Comminication Engineers of Japan, pp. 182 (with English translation).

"Single–Mode Optical Fiber with Large Effective Core Area", by Aikawa et al., Proceedings for the 1999 Conference of Electronics Society of Institute of Electronics and Communication Engineers of Japan, p. 183 (with English translation).

* cited by examiner

Primary Examiner—Cuong Quang Nguyen
(74) Attorney, Agent, or Firm—McDermott, Will & Emery

(57) ABSTRACT

A semiconductor device comprises a plurality of superposed layers including a predetermined layer provided, in a peripheral part of a chip, with a dummy pattern of a material that is the same as that forming a wiring pattern formed in the same predetermined layer, the dummy pattern being formed on an inner side of a dicing region. The ratio of an area of the dummy pattern in a planar region defined by the inner edge of the dummy pattern, the outer edge of the dicing region and two optional, parallel lines to that of the planar region is 50% or above.

7 Claims, 8 Drawing Sheets

Chip wiring region | CMP dummy pattern region | Chip frame region | Dicing region Chip wiring region | CMP dummy pattern region | Chip frame region | Dicing region

SEMICONDUCTOR DEVICE WITH REDUCED CMP DISHING

BACKGROUND OF THE INVENTION

1. Field of the Invention

The present invention relates to a semiconductor device, a method of manufacturing the same and a method of designing the same. More particularly, the present invention is suitable for a semiconductor device manufactured by a method including a flattening step employing a chemical mechanical polishing process (CMP process).

2. Background Art

When manufacturing recent semiconductor devices, it is difficult to form a minute wiring pattern on a greatly stepped interlayer insulating film and improvement of the planarity of the interlayer insulating film has been necessary. A global flattening method employing a CMP process has become prevalently used in recent years. When using the flattening method employing the CMP process, a dummy pattern for CMP must be formed in a wiring layer underlying an interlayer insulating film to be subjected to the CMP process to avoid dishing.

Dishing is the variation of a layer insulting film polishing characteristic according to the line density of a wiring layer underlying the interlayer insulating film. When dishing occurs, portions of the interlayer insulating film overlying regions in which wiring lines are not formed of the wiring layer or regions in which wiring lines are formed at a low line density are polished by a polished amount greater than that by which portions of the interlayer insulating film overlying regions in which wiring lines are formed in a high line density of the wiring layer are polished. If dishing occurs, the surfaces of portions of the interlayer insulating film overlying the regions of the wiring layer in which wiring lines are formed in high line densities are polished excessively with the proceeding of polishing and, if the worst comes to the worst, the underlying wiring layer is polished to deteriorate the wiring pattern of the wiring layer.

The dummy pattern for CMP is formed to make uniform line density in the wiring layer underlying the interlayer insulating film to be polished. Thus, dishing can be suppressed and the deterioration of the planarity of the interlayer insulating film can be prevented by forming the dummy pattern in predetermined regions in addition to the wiring pattern necessary for the operation of the semiconductor device.

However, chips in a semiconductor wafer are separated from each other by dicing regions. Since the dummy pattern cannot be formed in the dicing regions, the planarity of parts of the interlayer insulating film near the dicing regions are unsatisfactory.

This problem will be described with reference to FIGS. 7 and 8. FIGS. 7 and 8 show a part of a semiconductor wafer having chips provided with semiconductor devices in a state before being processed by a dicing process, in which semiconductor elements are formed on the semiconductor wafer, a wiring layer 100 is formed, and a interlayer insulting film 101 is formed on the wiring layer 100. The wiring layer 100 shown in FIGS. 7 and 8 is an (n)th (n is a natural number) wiring layer of a semiconductor device among a plurality of wiring layers, and the other wiring layers are omitted. FIG. 7 is a plan view and FIG. 8 is a sectional view of the semiconductor device. FIG. 8A is a sectional view taken on line III–III' in FIG. 7 and FIG. 8B is a sectional view taken on line IV–IV' in FIG. 7. In FIG. 7, the interlayer insulating film 101 is omitted to facilitate understanding.

As shown in FIG. 8A, the respective line densities of an (n)th layer dicing region, a chip wiring region and a CMP dummy pattern region in the vicinity of a dicing region in which an alignment mark is formed in the wiring layer 100 are nearly equal to each other, and hence the difference between parts of the interlayer insulating film 101 respectively corresponding to those regions in polished amount by which the interlayer insulating film will be removed by the CMP process is small.

As shown in FIG. 8B, any wiring pattern consists of the wiring layer 100 cannot be formed in parts corresponding to the dicing region. Therefore, the line density in the dicing region is very small as compared with those in the chip wiring region, the CMP dummy pattern region and a chip frame region. Consequently, the polished amount by which the interlayer insulating film 101 is removed by the CMP process increases gradually from the chip wiring region toward the dicing region and the chip wiring lines 100a nearest to the dicing region are polished to deteriorate the patterns of the chip wiring lines 100a, resulting in deterioration of the wiring pattern and the resultant reduction of the reliability of the device.

SUMMARY OF THE INVENTION

The present invention has been made to solve such a problem and it is therefore a first object of the present invention to provide a semiconductor device, a method of manufacturing the semiconductor device and a method of designing the semiconductor device that enable the further improvement of the planarity in a peripheral part of a chip when a flattening step employing a CMP process is used.

A second object of the present invention is to improve the construction of a peripheral part of a chip provided with a screening pattern for flattening.

According to one aspect of the present invention, a semiconductor device comprises a plurality of superposed layers on a semiconductor substrate including a predetermined layer provided, in a peripheral part of a chip, with a dummy pattern of a material that is the same as that forming a wiring pattern formed in the same predetermined layer. The dummy pattern is formed on an inner side of a dicing region. The ratio of an area of the dummy pattern in a planar region defined by an inner edge of the dummy pattern, an outer edge of the dicing region and two optional, parallel lines to that of the planar region is 50% or above.

According to another aspect of the present invention, a method of manufacturing a semiconductor device, a wiring layer is formed over an insulating film formed on a semiconductor substrate firstly. Secondly, parts of the wiring layer is selectively removed to form a predetermined wiring pattern and a dummy pattern on an inner side of a dicing region in a peripheral part of a chip, and setting an area of the dummy pattern so that the ratio of an area of the dummy pattern in a planar region defined by an inner edge of the dummy pattern, an outer edge of the dicing region and two optional, parallel lines to that of the planar region is 50% or above. An interlayer insulating film is formed over the insulating film so as to cover the wiring pattern and the dummy pattern thirdly. A surface of the interlayer insulating film is plnarized by polishing fourthly.

According to another aspect of the present invention, a method of designing a semiconductor device, a predetermined wiring pattern and a predetermined dummy pattern is respectively arranged from a predetermined wiring layer formed on a semiconductor substrate on an inner side of a dicing region in a peripheral part of a chip firstly. The ratio of an area of the dummy pattern in a planar region defined by an outer edge of the dicing region, an inner edge of the dummy pattern and two optional, parallel lines to that of the planar region is calculated secondly. The ratio of the area of the dummy pattern is compared with that of the planar region with a predetermined threshold thirdly. The area of the dummy pattern is increased when the ratio of the area of the dummy pattern to that of the planar region is smaller than the predetermined threshold fourthly.

According to the present invention, when the surface of the interlayer insulating film is polished by a CMP process for planarization, the planarity of the peripheral part of the chip can be further improved and the deterioration of the wiring pattern in the peripheral part of the chip can be suppressed because the size of the dummy pattern is determined so that the line density in the specified planar region is 50% or above.

Other and further objects, features and advantages of the invention will appear more fully from the following description.

DETAILED DESCRIPTION OF THE PREFERRED EMBODIMENTS

First Embodiment

Figure 1:
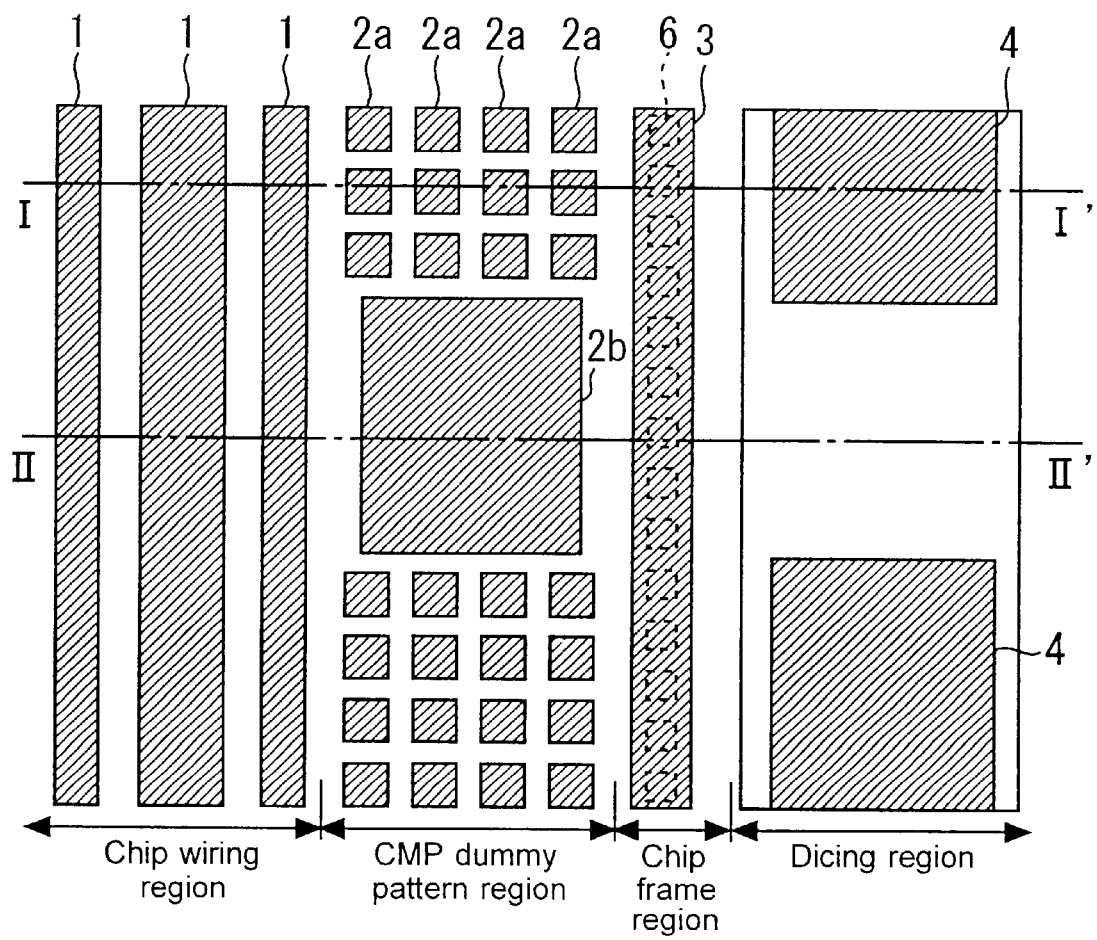
FIG. 1 is a typical plan view of a semiconductor device in a first embodiment according to the present invention.
Figure 2A:
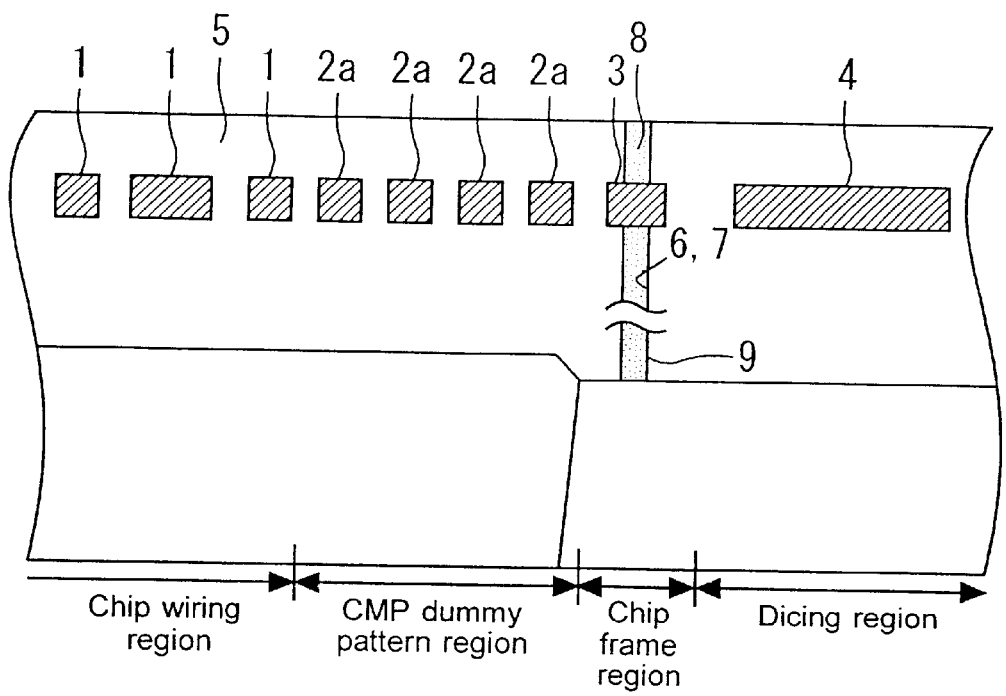
FIGS. 2A and 2B are typical sectional views taken on line I–I' and on line II–II' in FIG. 1, respectively.
Figure 2B:
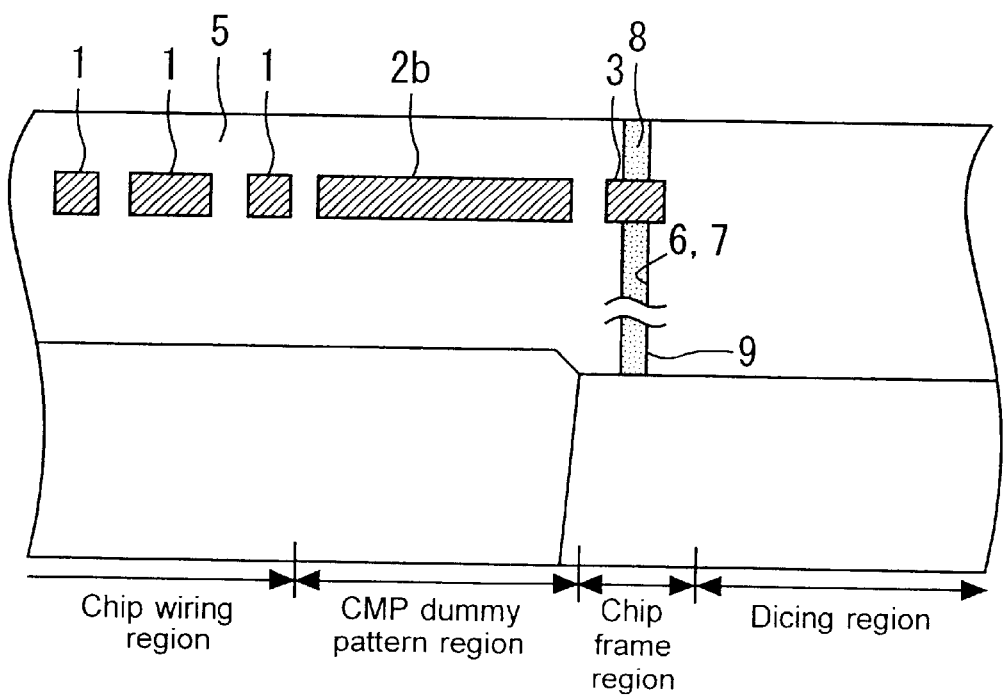

FIGS. 1 and 2 show a semiconductor device in a first embodiment according to the present invention formed on a semiconductor wafer in a state before the semiconductor wafer is subjected to a dicing process. In this state, semiconductor elements are manufactured on the semiconductor wafer, and then wiring layers and interlayer insulating films are formed over the semiconductor elements. In FIGS. 1 and 2, only an (n)th (n is a natural number) wiring layer from below among a plurality of wiring layers of the semiconductor devise is shown by way of example, and the other wiring layers are omitted. FIG. 1 is a typical plan view of a semiconductor device in a first embodiment according to the present invention and FIG. 2A is a typical sectional view taken on line I–I' in FIG. 1, FIG. 2B is a typical sectional view taken on line II–II' in FIG. 1, respectively. In FIG. 1, an interlayer insulating film 5 is omitted to facilitate understanding.

Referring to FIGS. 1 and 2, a plurality of semiconductor devices formed on the semiconductor wafer are demarcated by dicing regions. The semiconductor wafer is cut along the dicing regions into a plurality of chips by a dicing machine. Chip wiring lines 1 formed by patterning the (n)th wiring layer are extended in a chip wiring region on the inner side of the dicing regions. The chip wiring lines 1 are necessary to operate the semiconductor chip.

A dummy pattern 2a, a screening pattern 3 and alignment mark 4 are formed in addition to the chip wiring lines 1 by patterning the (n)th wiring layer. The dummy pattern 2a, the screening pattern 3 and the alignment mark 4 are formed in a CMP dummy pattern region, a chip frame region and the dicing region, respectively.

The chip frame region is on the side of the dicing region in a region between the dicing region and the chip wiring region. The CMP dummy pattern region is on the side of the chip wiring region in a region between the dicing region and the chip wiring region. The dicing regions are arranged in a grid on the wafer so as to demarcate parts corresponding to the chips. Therefore, the chip frame region and the CMP dummy pattern region are formed so as to surround each chip.

Layer insulating films 5 are formed over and under the chip wiring lines 1, the dummy pattern 2a, the screening pattern 3 and the alignment marks 4 formed by patterning the (n)th wiring layer to electrically isolate the (n)th wiring layer from (n+1)th and (n−1)th wiring layer, respectively.

As shown in FIG. 2A, via holes 6 are formed in parts of the interlayer insulating film 5 underlying the screening pattern 3. The screening pattern 3 is connected by a conducive film filled with the via holes 6 to a lower screening pattern, not shown, formed in the (n−1)th wiring layer underlying the (n)th wiring layer. Similarly, via holes 8 are formed in parts of the interlayer insulating film 5 overlying the screening pattern 3. The screening pattern 3 are connected by a conductive film filled with the via holes 8 to an upper screening pattern, not shown, formed in the (n+1)th wiring layer overlying the (n)th wiring layer. Thus, the screening patterns formed in the chip frame regions of all the wiring layers are connected by the conductive films filled with the via holes, and the chip is surrounded by a structure consisting of the screening patterns and the via holes to prevent the leakage of moisture and the like into the chip.

As shown in FIG. 1, in the first embodiment, a dummy pattern 2b of an area larger than that of the dummy pattern 2a is formed in the CMP dummy pattern region in an area corresponding to an area not provided with any alignment mark in the dicing region. The large dummy pattern 2b formed near the dicing region in which the (n)th wiring layer cannot be formed compensates the low line density(the density of the area of the (n)th wiring layer in plan view) in the dicing region, so that the polishing of the chip wiring lines 1 due to dishing can be prevented when polishing the interlayer insulating film 5 overlying the (n)th wiring layer by a CMP process.

The aforesaid effect of the large dummy pattern 2b will be described with reference to FIG. 2. The alignment mark 4 is in a section of the chip shown in FIG. 2A in a sectional view taken on line I–I' in FIG. 1 and hence the line density in the dicing region of the (n)th wiring layer is not very small. Therefore, a part of the interlayer insulating film 5 corresponding to a part of the (n)th wiring layer around the line I–I' can be polished substantially uniformly and hence the deterioration of the pattern of the chip wiring lines 1 can be limited to the least extent.

The alignment mark 4 is not formed and the dicing region of the (n)th wiring layer cannot be formed in a section of the chip shown in FIG. 2B in a sectional view taken on line II–II' in FIG. 1 and hence the line density in the dicing region of the (n)th wiring layer is very small. However, the large dummy pattern 2b is formed in the CMP dummy pattern region as shown in FIG. 2(b). Therefore, even if a part of the interlayer insulating film 5 corresponding to the dicing region is polished excessively due to dishing, the chip wiring region is not affected by the excessive polishing of the part of the interlayer insulating film 5. Thus, the excessive polishing of the part of the interlayer insulating film 5 corresponding to the chip wiring region can be suppressed and the deterioration of the pattern of the chip wiring lines 1 which operate the chip actually can be limited to the least extent.

Desirably, the size of the dummy pattern 2b is decided by the following method. Referring to FIG. 1, a optional planar region defined by the inner edge of the CMP dummy pattern region, the outer edge of the dicing region and two optional parallel lines, such as a rectangular region defined by the chain lines I–I' and II–II', the inner edge of the CMP dummy pattern region and the outer edge of the dicing region, is specified. The line density in the specified planar region, i.e., the ratio of the area of the wiring layer (chip wiring lines 1, the dummy patterns 2a and 2b, the screening pattern 3 and the alignment mark 4) in the specified planar region to that of the specified planer region, is calculated by using:

(Line density)(%)=(Area of the wiring layer in the specified planar region)/(Area of the specified planar region)×100.

The inner edge of the CMP dummy pattern region is an edge on the side of the chip wiring region, i.e., the boundary between the CMP dummy patter region and the chip wiring line region. The outer edge of the dicing region is a right edge as viewed in FIG. 1, i.e., the boundary between the dicing region and another chip contiguous with the dicing region.

When deciding the arrangement of the patterns of the wiring layer including the chip wiring lines 1, the patterns are arranged and an optional planar region is specified on the patterns. Then, the ratio of the area of the dummy pattern to the area of the specified planar region (line density) is calculated. The size of the dummy pattern 2b is determined so that the line density in the specified planar region is 50% or above. If the line density is less than 50%, the dummy pattern 2b is enlarged such that the line density in the specified planar region is 50% or above. The patterns can be arranged by this designing method so that the occurrence of dishing can be surely suppressed.

A method of manufacturing the semiconductor device shown in FIGS. 1 and 2 will be briefly described. The (n−1)th wiring layer is patterned to form a wiring pattern, an interlayer insulating film 5 is formed so as to cover the (n−1) wiring layer, and the surface of the interlayer insulating film 5 is planarized.

Subsequently, the (n)th wiring layer is formed on the interlayer insulating film 5. The chip wiring lines 1, the dummy patterns 2a and 2b, the screening pattern 3 and the alignment mark 4 are formed by patterning the (n)th wiring layer by a photolithographic process and a following dry etching process. The size of the dummy pattern 2b is determined when arranging the patterns in the photolithographic process so that the line density in the optional specified planar region is 50% or above using the above-mentioned design method.

Another layer insulating film 5, i.e., an (n)th layer insulating film, is formed so as to cover the chip wiring lines 1, the dummy patterns 2a and 2b, the screening pattern 3 and the alignment mark 4, and the surface of the (n)th layer insulating film 5 is polished by a CMP process for planarization. The dummy pattern 2b of the size meeting the predetermined condition suppresses the polishing of the chip wiring lines 1 due to dishing and suppresses the deterioration of the pattern of the chip wiring lines 1.

In the first embodiment, the influence of dishing on the chip wiring lines 1 can be suppressed even if the part of the interlayer insulating film 5 overlying the dicing region is polished excessively due to dishing by forming the dummy pattern 2b of a large area in the region in which the (n)th wiring layer cannot be formed near the dicing region. The deterioration of the pattern of the chip wiring lines 1 can be limited to the least extent by determining the size of the dummy pattern 2b such that the line density in the optionally specified planar region is 50% or above.

Second Embodiment

Figure 3:
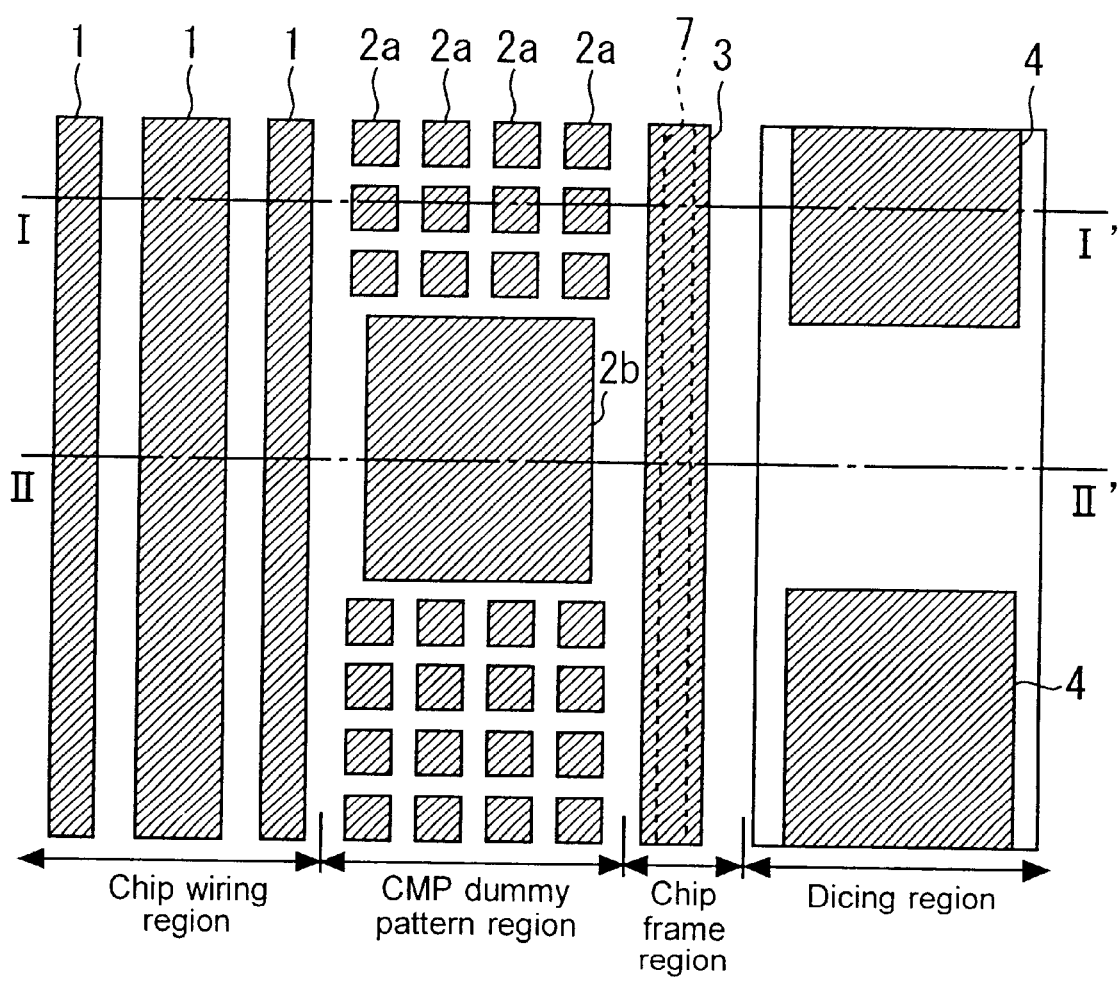
FIG. 3 is a typical plan view of a semiconductor device in a second embodiment according to the present invention.

FIG. 3 is a plan view of a semiconductor device in a second embodiment according to the present invention formed on a semiconductor wafer in a state before the wafer is subjected to a dicing process. The first embodiment is provided with the screening pattern 3 formed in the (n)th wiring layer, and via holes 6 of a rectangular plan view for connecting the (n)th wiring layer to the (n−1)th wiring layer. The second embodiment is provided with a via hole 7 having the shape of an elongate slot and formed under and along a screening pattern 3. The screening pattern 3 is connected by a conductive film filled with the via hole 7 to the screening pattern of the (n−1)th wiring layer underlying the (n)th wiring layer. Sections on chain lines I–I' and II–II' in FIG. 3 are similar to those shown in FIGS. 2A and 2B.

In the second embodiment, the screening pattern 3 is connected by the conductive film filled with the via hole 7 having the shape of an elongate slot to the screening pattern of the (n−1)th wiring layer underlying the (n)th wiring layer. Thus, the screening pattern 3 can be surely supported from the under side and the excessive polishing of a part overlying chip wiring lines 1 of an interlayer insulating film 5 due to dishing can be more effectively suppressed. A dummy pattern 2b of a large area formed in a CMP dummy pattern region has the same effect as that of the dummy pattern 2b of the first embodiment.

Third Embodiment

Figure 4:
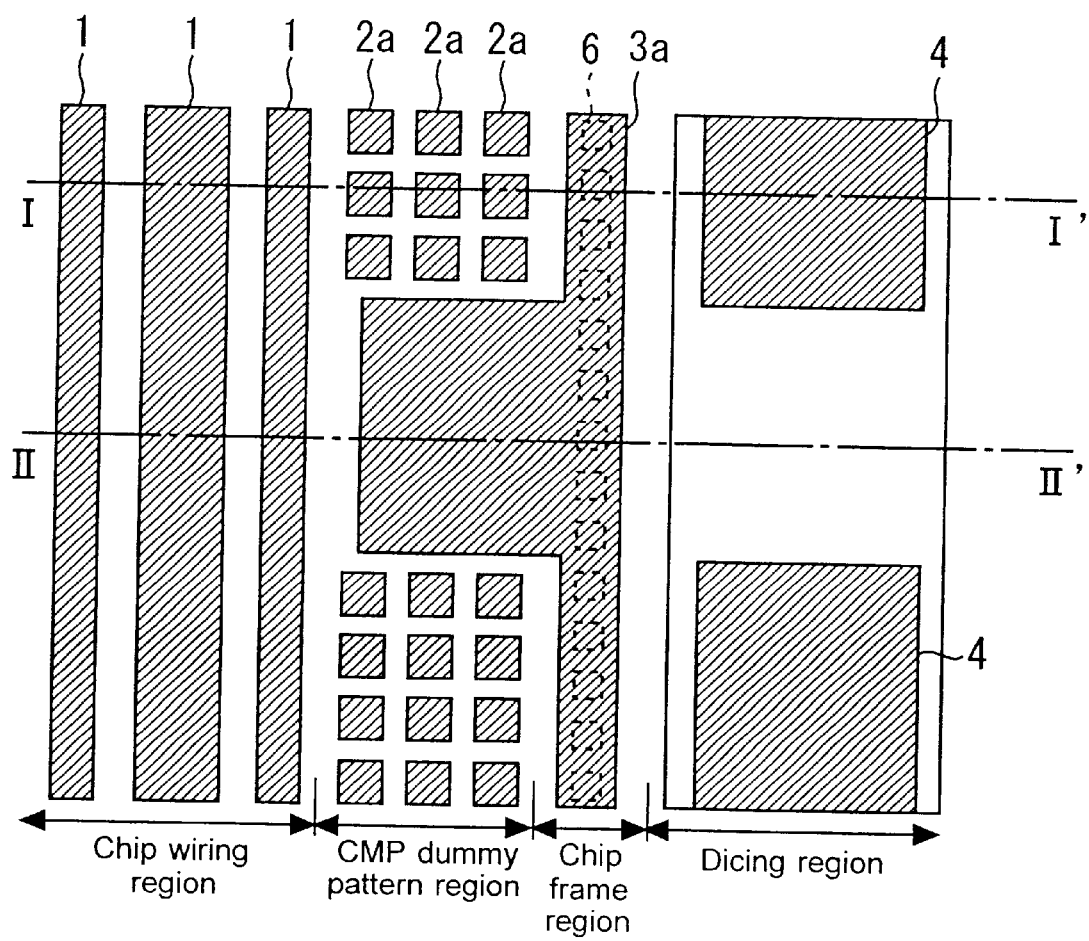
FIG. 4 is a typical plan view of a semiconductor device in a third embodiment according to the present invention.
Figure 5A:
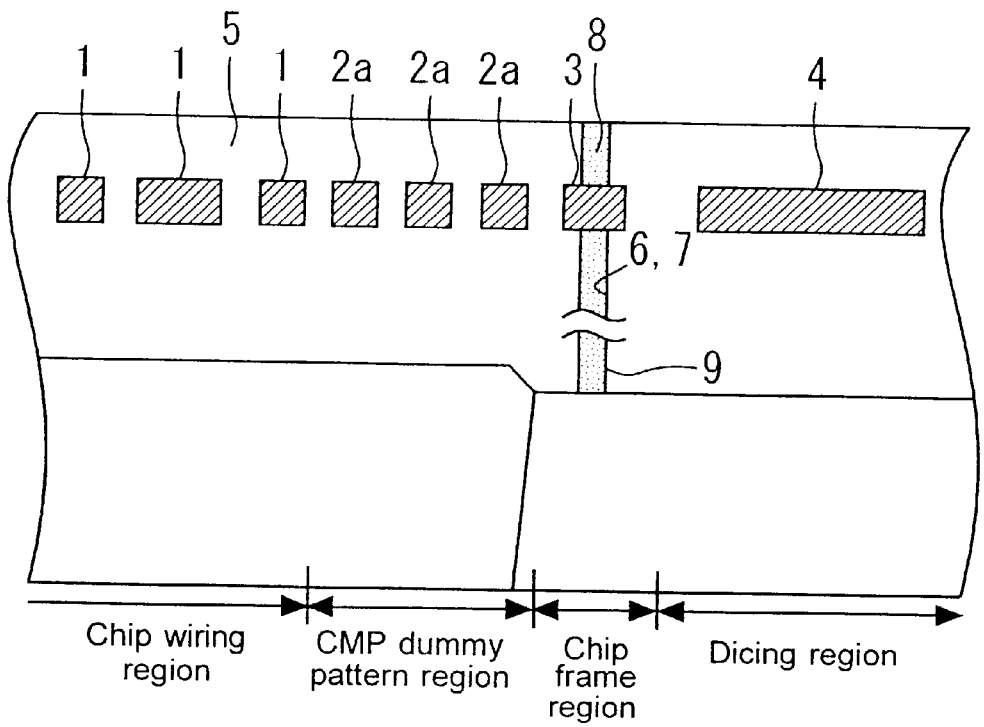
FIGS. 5A and 5B are typical sectional views taken on line I–I' and on line II–II' in FIG. 4, respectively.
Figure 5B:
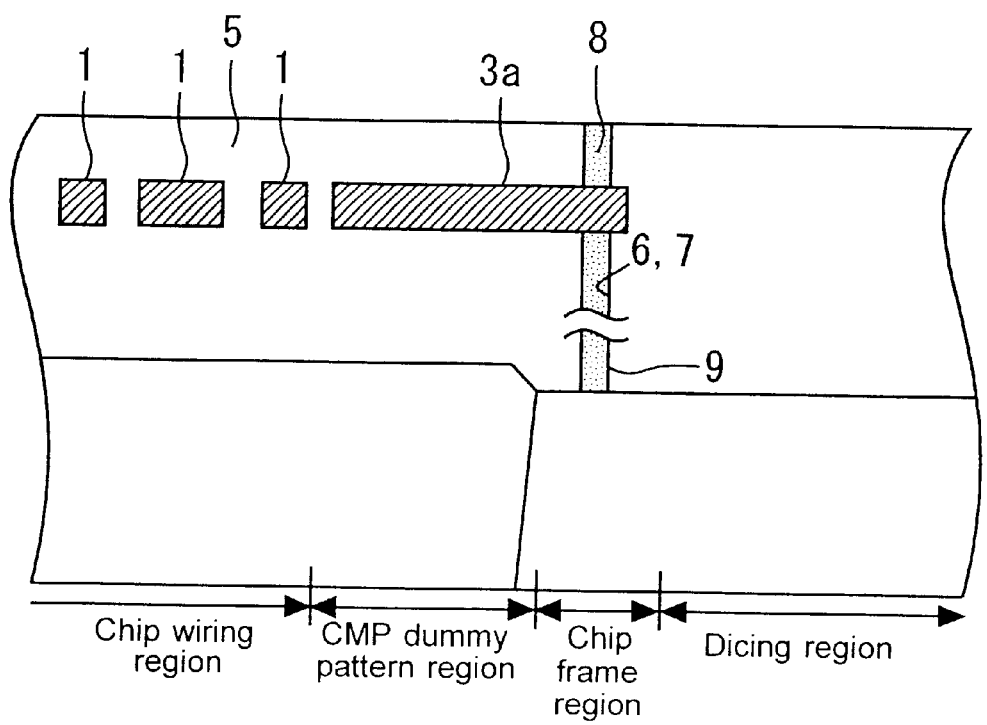

FIGS. 4 and 5 show a semiconductor device in a third embodiment according to the present invention formed on a semiconductor wafer in a state before the semiconductor wafer is subjected to a dicing process. Semiconductor elements are manufactured on the semiconductor wafer, wiring layers and interlayer insulating films are formed over the semiconductor elements. In FIGS. 4 and 5, only an (n)th wiring layer among the plurality of wiring layers is shown by way of example, and the other wiring layers are omitted. FIG. 4 is a typical plan view of a semiconductor device in a third embodiment according to the present invention and FIGS. 5A and 5B are typical sectional views taken on line I–I' and on line II–II' in FIG. 4, respectively. In FIG. 4, an interlayer insulating film 5 is omitted to facilitate understanding.

The third embodiment, similarly to the first embodiment, is provided with a dummy pattern of a relatively large area formed in a part of a CMP dummy region near a dicing region in which the (n)th wiring layer cannot be formed, so that the decreasing of the line density can be suppressed in the CMP dummy pattern region. Further in the third embodiment, a part of the (n)th wiring layer forming a screening pattern 3a in a chip frame region is extended into the CMP dummy pattern region so that the screening pattern 3a merges into the dummy pattern formed in the CMP dummy pattern layer as shown in FIG. 4; that is, the screening pattern 3a and the dummy pattern are continuous.

The line density of the CMP dummy pattern region can be increased by extending the screening pattern 3a into the CMP dummy pattern region similarly to the first embodiment. The screening pattern 3a is formed in a size such that the line density in an optional region in a plan view of FIG. 4 similar to that in the first embodiment is 50% or above.

Fourth Embodiment

Figure 6:
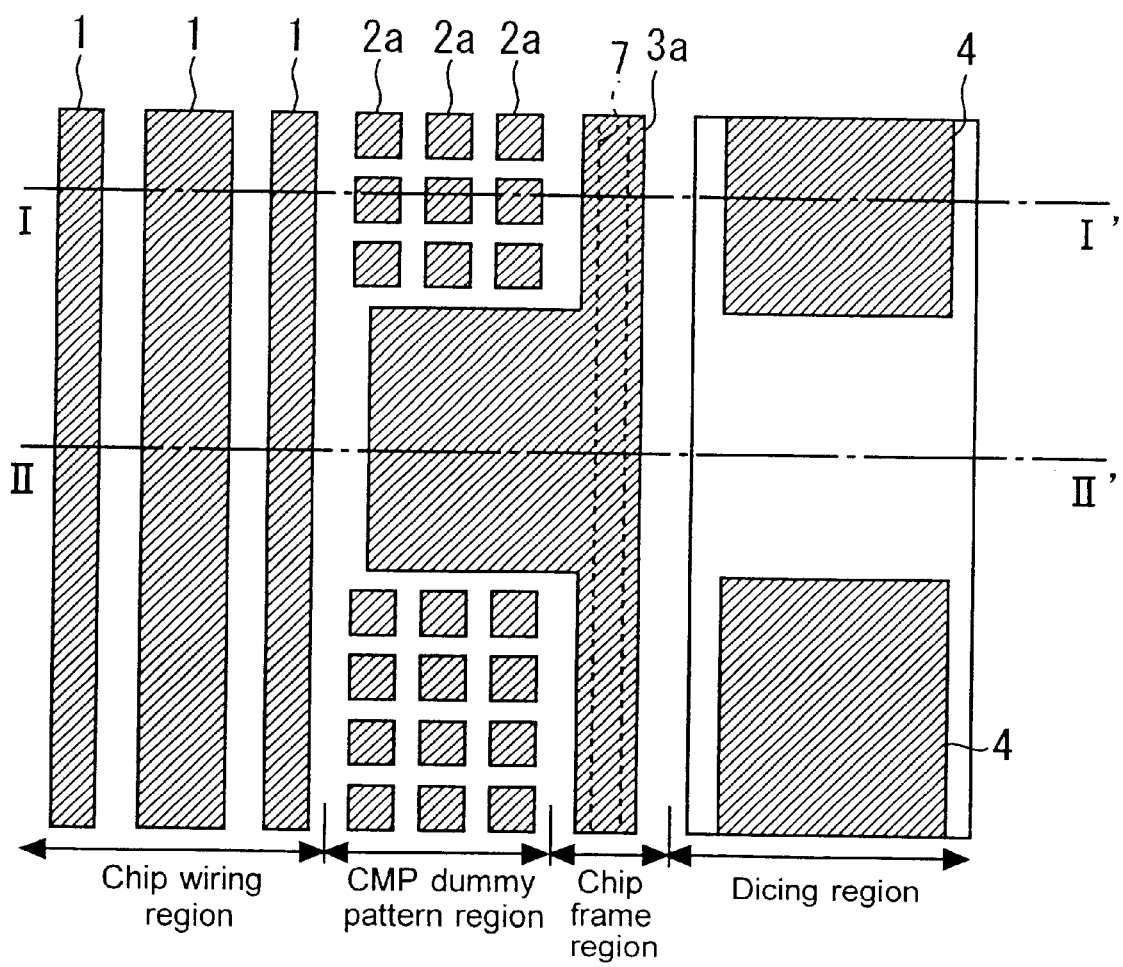
FIG. 6 is a typical plan view of a semiconductor device in a fourth embodiment according to the present invention.
Figure 7:
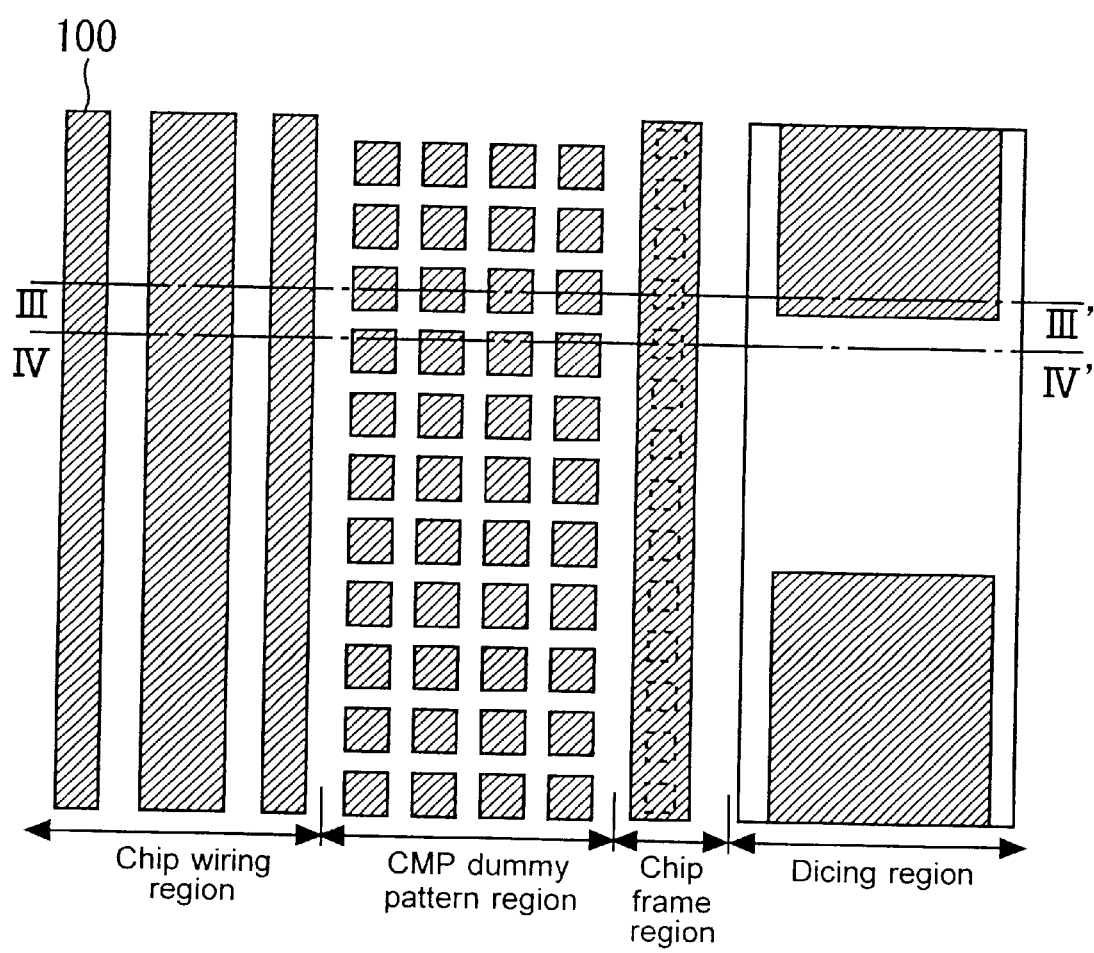
FIG. 7 is a typical plan view of a conventional semiconductor device.
Figure 8A:
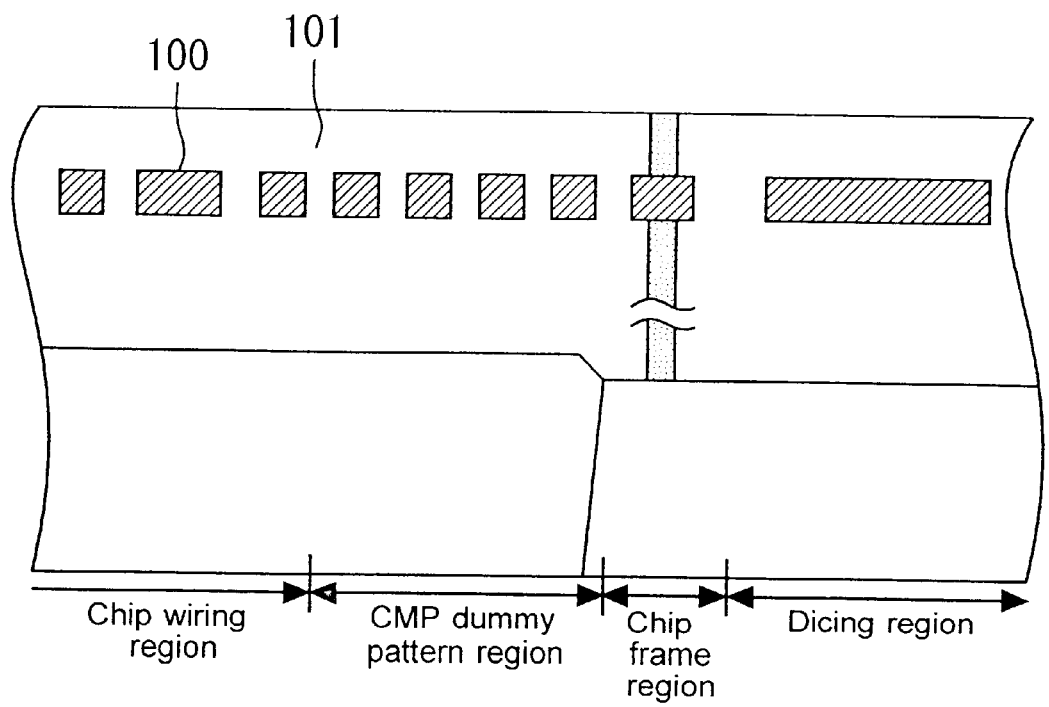
FIGS. 8A and 8B are typical sectional views taken on line III–III' and on line IV–IV' in FIG. 7, respectively.
Figure 8B:
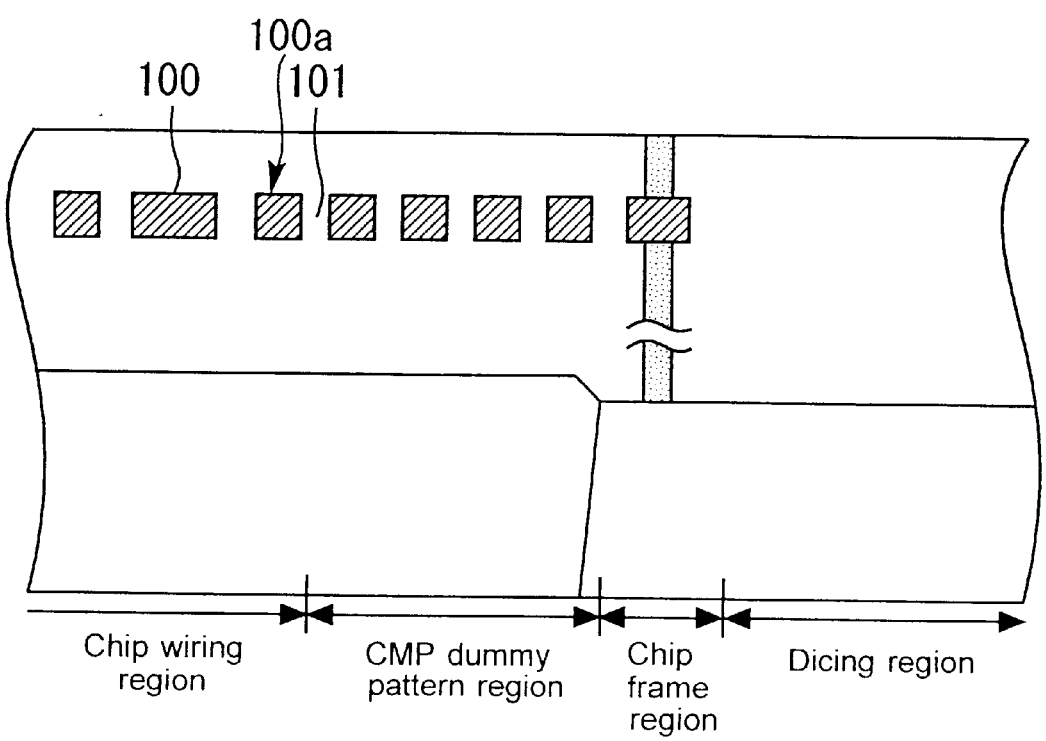

FIG. 6 shows a semiconductor device in a fourth embodiment according to the present invention formed on a semiconductor wafer in a state before the semiconductor wafer is subjected to a dicing process. The third embodiment is provided with via holes 6 of a rectangular plan view as shown in FIG. 4 for connecting the screening pattern 3a of the (n)th wiring layer to a screening pattern included in an (n−1)th wiring layer underlying the (n)th wiring layer. The fourth embodiment is provided with a via hole 7 having the shape of an elongate slot and formed under and along a screening pattern 3a. As shown in FIG. 6, the screening pattern 3a is connected by a conductive film filled with the via hole 7 to the screening pattern of the (n−1)th wiring layer underlying the (n)th wiring layer. Sections on chain lines I–I' and II–II' in FIG. 6 are similar to those shown in FIGS. 5A and 5B.

The fourth embodiment, similarly to the second embodiment, has the screening pattern 3a connected by the conductive film filled with the via hole 7 having the shape of an elongate slot to the screening pattern of the (n−1)th wiring layer underlying the (n)th wiring layer formed in a chip frame region. Thus, the screening pattern 3a can be surely supported from the under side and the excessive polishing of a part overlying chip wiring lines 1 of an interlayer insulating film 5 due to dishing can be more effectively suppressed. The fourth embodiment exercises the same effect as that exercised by the third embodiment because the screening patter 3a is extended into the CMP dummy pattern region.

When the surface of the interlayer insulating film is polished by a CMP process for planarization, the planarity of the peripheral part of the chip can be further improved and the deterioration of the wiring pattern in the peripheral part of the chip can be suppressed because the size of the dummy pattern is determined so that the line density in the specified planar region is 50% or above.

Since the dummy pattern is formed near the screening pattern, the line density in the region around the screening pattern and the dummy pattern can be increased and hence the plnarity of the peripheral part of the chip can be further improved.

Since the screening pattern of the (n)th wiring layer is connected to the screening pattern of the (n−1)th wiring layer underlying the (n)th wiring layer by the conductive film filled with the via hole having the shape of a slot extending along the screening pattern, planarization can be more efficiently achieved.

The line density in the specified planar region, i.e., the ratio of the area of the wiring layer in the specified planar region to that of the specified planer region, is calculated, and the area of the dummy pattern is increased if the line density is less than a predetermined threshold. Thus, the planarity of the peripheral part of the chip can be further improved and the deterioration of the wiring pattern in the peripheral part of the chip can be suppressed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-2331, filed on Jan. 10, 2001 including specification, claims, drawings and summary, on which the Convention priority of the present application is based, are incorporated herein by reference in its entirety.

What is claimed:

1. A semiconductor device comprising a plurality of superposed layers on a semiconductor substrate including a predetermined layer provided, in a peripheral part of a chip, with a dummy pattern of a material that is the same as that forming a wiring pattern formed in the same predetermined layer, said dummy pattern being formed on an inner side of a dicing region extending in a first direction;

wherein the ratio of an area of said dummy pattern in a planar region surrounded by an inner edge of said dummy pattern, an outer edge of said dicing region and two arbitrary, parallel lines perpendicular to the first direction to that of said planar region is 50% or above.

2. The semiconductor device according to claim 1, wherein said predetermined layer is provided with a screening pattern of a material that is the same as that forming said wiring pattern, extending along said peripheral part of the chip, and said dummy pattern is disposed near said screening pattern.

3. The semiconductor device according to claim 2, wherein said dummy pattern is continuous with said screening pattern.

4. The semiconductor device according to claim 2, wherein a lower screening pattern for a lower layer underlying an interlayer insulating film underlying said screening pattern is formed, said screening pattern is connected to said lower screening pattern by a conductive film filled with a via hole formed in said interlayer insulating film, said via hole having a shape of a slot extending along said screening pattern.

5. The semiconductor device according to claim 3, wherein a lower screening pattern for a lower layer underlying an interlayer insulating film underlying said screening pattern is formed, said screening pattern is connected to said lower screening pattern by a conductive film filled with a via hole formed in said interlayer insulating film, said via hole having a shape of a slot extending along said screening pattern.

6. The semiconductor device according to claim 2, wherein a lower screening pattern for a lower layer underlying an interlayer insulating film underlying said screening pattern is formed, said screening pattern is connected to said lower screening pattern by a conductive film filled in a via hole formed in said interlayer insulating film.

7. The semiconductor device according to claim 3, wherein a lower screening pattern for a lower layer underlying an interlayer insulating film underlying said screening pattern is formed, said screening pattern is connected to said lower screening pattern by a conductive film filled in a via hole formed in said interlayer insulating film.

* * * * *

UNITED STATES PATENT AND TRADEMARK OFFICE
CERTIFICATE OF CORRECTION

PATENT NO. : 6,690,045 B2
DATED : February 10, 2004
INVENTOR(S) : Hiroki Shinkawata It is certified that error appears in the above-identified patent and that said Letters Patent is hereby corrected as shown below:

<u>Title page,</u>
Item [73], Assignee, change "Mitsubishi Denki Kabushiki Kaisha, Tokyo (JP)" to
-- Renesas Technology Corp., Tokyo (JP) --.

Signed and Sealed this

Fifteenth Day of March, 2005

JON W. DUDAS
*Director of the United States Patent and Trademark Office*